United States Patent
Sarode et al.

(10) Patent No.: US 12,412,769 B2
(45) Date of Patent: Sep. 9, 2025

(54) ELECTROSTATIC CHUCKS WITH HYBRID PUCKS TO IMPROVE THERMAL PERFORMANCE AND LEAKAGE CURRENT STABILITY

(71) Applicant: Applied Materials, Inc., Santa Clara, CA (US)

(72) Inventors: Yogananda Sarode, Bangalore (IN); Anand Kumar, Bengaluru (IN); Prashant V. Javali, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 209 days.

(21) Appl. No.: 18/198,003

(22) Filed: May 16, 2023

(65) Prior Publication Data
US 2024/0387224 A1    Nov. 21, 2024

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67109* (2013.01); *H01L 21/68785* (2013.01)

(58) Field of Classification Search
CPC .......... H01L 21/6833; H01L 21/67109; H01L 21/68785
See application file for complete search history.

(56) References Cited

U.S. PATENT DOCUMENTS

| | | | |
|---|---|---|---|
| 6,204,489 B1 * | 3/2001 | Katsuda | H05B 3/283 219/544 |
| 11,387,134 B2 | 7/2022 | Mustafa | |
| 2005/0207088 A1 * | 9/2005 | Nishimoto | H01L 21/6831 361/234 |
| 2005/0231887 A1 * | 10/2005 | Zandi | H01L 21/6833 361/234 |
| 2016/0333475 A1 * | 11/2016 | Gomm | C23C 16/4586 |
| 2017/0271179 A1 | 9/2017 | Parkhe et al. | |
| 2020/0006095 A1 * | 1/2020 | Miwa | H01L 21/3065 |
| 2020/0243372 A1 * | 7/2020 | Aoto | H01L 21/67098 |
| 2021/0313213 A1 | 10/2021 | Kraus et al. | |
| 2021/0320022 A1 | 10/2021 | Cui | |
| 2022/0037121 A1 * | 2/2022 | Dorf | H01J 37/32146 |
| 2022/0399184 A1 | 12/2022 | Cui et al. | |

FOREIGN PATENT DOCUMENTS

| | | |
|---|---|---|
| JP | 2004095665 A | 3/2004 |
| KR | 20130094578 A | 8/2013 |

OTHER PUBLICATIONS

International Search Report and Written Opinion for International Application No. PCT/US2024/029319, mailed Sep. 5, 2024, 09 pages.

* cited by examiner

*Primary Examiner* — Scott Bauer
(74) *Attorney, Agent, or Firm* — Lowenstein Sandler LLP (57) ABSTRACT

A device includes a hybrid puck corresponding to an electrostatic chuck. The hybrid puck includes a backing region and a chucking region disposed on the backing region. The backing region includes a first dielectric material to improve thermal performance of the hybrid puck. The chucking region includes a second dielectric material different from the first dielectric material to improve leakage current stability.

20 Claims, 9 Drawing Sheets

ELECTROSTATIC CHUCKS WITH HYBRID PUCKS TO IMPROVE THERMAL PERFORMANCE AND LEAKAGE CURRENT STABILITY

TECHNICAL FIELD

Embodiments of the present invention relate, in general, to substrate processing, and in particular, to electrostatic chucks (ESCs) with hybrid pucks to implement electrostatic chucks with improved thermal performance and stability.

BACKGROUND

An electronic device manufacturing apparatus can include multiple chambers, such as processing chambers and load lock chambers. Such an electronic device manufacturing apparatus can employ a robot apparatus in the transfer chamber that is configured to transport substrates between the multiple chambers. In some instances, multiple substrates are transferred together. Processing chambers may be used in an electronic device manufacturing apparatus to perform one or more processes on substrates, such as deposition processes, etch processes and/or lithography processes. An electrostatic chuck (ESC) is a device that can generate electrostatic force to securely hold a substrate (e.g., wafer) in place against a puck without requiring physical force during one or more processes, such as during deposition, etching and/or lithography processes. Utilizing electrostatic force, without requiring physical force, can reduce the risk of damage to the substrate during processing and can create a more stable and/or uniform hold as compared to other chucks (e.g., mechanical chucks).

SUMMARY

In some embodiments, a device is provided. The device includes a hybrid puck corresponding to an electrostatic chuck. The hybrid puck includes a backing region and a chucking region disposed on the backing region. The backing region includes a first dielectric material to improve thermal performance of the hybrid puck. The chucking region includes a second dielectric material different from the first dielectric material to improve leakage current stability.

In some embodiments, a substrate support assembly is provided. The substrate support assembly includes a base structure including a cooling plate having a plurality of cooling channels, and a hybrid puck corresponding to an electrostatic chuck and disposed on the base structure. The hybrid puck includes a backing region disposed on the base structure and a chucking region disposed on the backing region. The backing region includes a first dielectric material to improve thermal performance of the hybrid puck. The chucking region includes a second dielectric material different from the first dielectric material to improve leakage current stability.

In some embodiments, a method is provided. The method includes obtaining a base structure including a cooling plate having a plurality of cooling channels, and attaching, to the base structure, a hybrid puck including a backing region disposed on the base structure and a chucking region disposed on the backing region. The backing region includes a first dielectric material to improve thermal performance of the hybrid puck. The chucking region includes a second dielectric material different from the first dielectric material to improve leakage current stability.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF THE DRAWINGS

Embodiments described herein are illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Described herein are embodiments of electrostatic chucks (ESCs) with hybrid pucks to improve thermal performance and leakage current stability. An ESC can include a flat plate, or puck, with a set of electrodes embedded in the surface of the puck. When a voltage is applied to the set of electrodes, an electrostatic field having a strength proportional to the applied voltage is created between the puck and the substrate as well as the distance between the surfaces of the puck and the substrate. Thus, when the applied voltage is sufficiently high, the electrostatic field can have sufficient strength to generate an electrostatic force that securely holds the substrate in place on the puck. ESCs can be designed to accommodate various different substrates sizes and/or shapes. For example, an ESC can have ring-shaped electrodes embedded within the puck to hold circular substrates. As another example, an ESC can have a grid pattern of electrodes embedded within the puck to hold square or rectangular substrates. The puck can be disposed on a cooling plate to enable substrate cooling.

Some pucks are formed from a single, monolithic dielectric material, such as a ceramic material. Although dielectric materials serve as electrical insulators, different dielectric materials can have different auxiliary properties. For example, some dielectric materials can have high thermal conductivity for improved substrate cooling using the cooling plate. As another example, some dielectric materials can offer leakage current stability. Leakage currents are unwanted electrical currents that flow through a device, which can be caused by defects within the material of the device that enable electron flow. Accordingly, some ESCs can sacrifice thermal conductivity for improved leakage current protection (or vice versa).

To address at least the above-noted drawbacks, embodiments described herein provide for ESCs with hybrid pucks to improve thermal performance and leakage current stability. A hybrid puck described herein can include a chucking region having a chucking surface, and a backing region underneath the chucking region. The backing region can be formed from a first dielectric material and the chucking region can be formed from a second dielectric material different from the first dielectric material. More specifically, the first dielectric material can be selected to improve thermal performance at the interface between the puck and the cooling plate. The second dielectric material can be selected to improve stability and leakage current consistency for the chucking surface. In some embodiments, at least one of the first dielectric material or the second dielectric material is a ceramic material. In some embodiments, first dielectric material includes aluminum nitride (AlN). In some embodiments, the second dielectric material includes aluminum oxide or alumina ($Al_2O_3$). In some embodiments, the chucking region and the backing region are bonded together with a bond. The chucking region and the backing region can be bonded together with any suitable type of bond. Examples of bonds include diffusion bonds, metal bonds, etc. Additionally, an ESC described herein can include a set of electrodes can be embedded within the puck to secure a substrate to the surface of the puck. An ESC can further include a cooling plate disposed underneath the puck, where the cooling plate includes a set of cooling channels to cool the substrate. For example, the puck can be bonded to the cooling plate using a bonding layer. The puck can include an outer cooling zone defined by an outer seal band and an inner cooling zone defined by an inner seal band. The hybrid puck can help reduce the temperature drop across the dielectric material to achieve a lower substrate temperature for a given cooling plate and a given coolant fluid condition. Further details regarding ESCs with hybrid pucks to improve thermal performance and leakage current stability are described herein below with reference to FIGS. 1-6.

Figure 1:
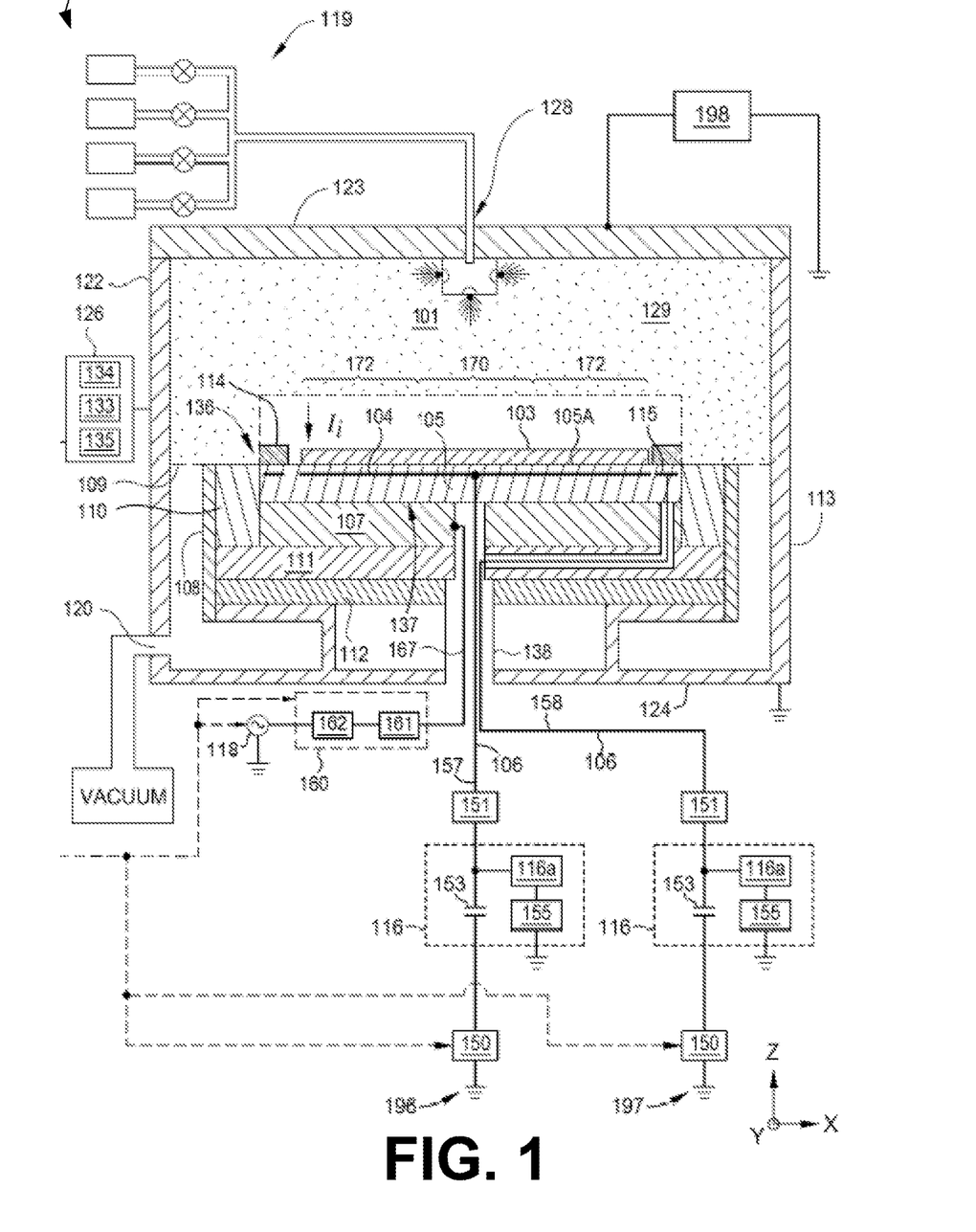
FIG. 1 is a diagram of a cross-sectional view of a processing chamber, in accordance with some embodiments.

FIG. 1 is a cross-sectional view of a processing chamber 100, in accordance with some embodiments. The plasma processing chamber 100 is configured to practice one or more of the biasing schemes proposed herein, according to one or more embodiments. In one embodiment, the processing chamber 100 is a plasma processing chamber, such as a reactive ion etch (RIE) plasma chamber. In some other embodiments, the processing chamber 100 is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some embodiments, the processing chamber 100 is a plasma treatment chamber or a plasma based ion implant chamber (e.g., a plasma doping (PLAD) chamber. In some embodiments, the plasma source is a capacitively coupled plasma (CCP) source, which includes an electrode (e.g., chamber lid 123) disposed in the processing volume facing the substrate support assembly 136. In some configurations, an opposing electrode, such as the chamber lid 123, which is positioned opposite to the substrate support assembly 136, is electrically coupled to ground. However, as illustrated in FIG. 1, the opposing electrode can alternately be electrically coupled to a source 198 that is coupled to ground, such as a source that includes an RF generator or a PV generator. In some embodiments, the processing chamber 100 may additionally or alternatively, include an inductively coupled plasma (ICP) source electrically coupled to a radio frequency (RF) power supply.

The processing chamber 100 also includes a chamber body 113 that includes the chamber lid 123, one or more sidewalls 122, and a chamber base 124, which define a processing volume 129. The one or more sidewalls 122 and chamber base 124 generally include materials that are sized and shaped to form the structural support for the elements of the plasma processing chamber 100, and are configured to withstand the pressures and added energy applied to them while a plasma 101 is generated within a vacuum environment maintained in the processing volume 129 of the plasma processing chamber 100 during processing. In one example, the one or more sidewalls 122 and chamber base 124 are formed from a metal, such as aluminum, an aluminum alloy, a stainless steel, etc. A gas inlet 128 disposed through the chamber lid 123 is used to provide one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103. Herein, the substrate 103 is transferred to and from a substrate receiving surface 105A of an ESC substrate support 105 using a lift pin system (not shown).

In some embodiments, an RF generator assembly 160 is configured to deliver RF power to the support base 107 disposed proximate to the ESC substrate support 105, and within the substrate support assembly 136. The RF power delivered to the support base 107 is configured to ignite and maintain a processing plasma 101 formed by use of process gases disposed within the processing volume 129. In some embodiments, the support base 107 is an RF electrode that is electrically coupled to an RF generator 118 via an RF matching circuit 162 and a first filter assembly 161, which are both disposed within the RF generator assembly 160. In some embodiments, the plasma generator assembly 160 and RF generator 118 are used to ignite and maintain a processing plasma 101 using the processing gases disposed in the processing volume 129 and fields generated by the RF power provided to the support base 107 by the RF generator 118. The processing volume 129 is fluidly coupled to one or more dedicated vacuum pumps, through a vacuum outlet 120, which maintain the processing volume 129 at sub-atmospheric pressure conditions and evacuate processing and/or other gases, therefrom. A substrate support assembly 136, disposed in the processing volume 129, is disposed on a support shaft 138 that is grounded and extends through the chamber base 124. However, in some embodiments, the RF generator assembly 160 is configured to deliver RF power to the biasing electrode 104 disposed in the substrate support 105 versus the support base 107.

The substrate support assembly 136, as briefly discussed above, generally includes a substrate support 105 (e.g., ESC substrate support) and support base 107. In some embodiments, the substrate support assembly 136 can additionally include an insulator plate 111 and a ground plate 112. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes a cooling plate including one or more cooling channels (not shown in FIG. 1) disposed therein that are fluidly coupled to, and in fluid communication with, a coolant source (not shown), such as a refrigerant source or water source having a relatively high electrical resistance. In some embodiments, the substrate support 105 includes a heater electrode (not shown in FIG. 1), such as a resistive heating element, embedded in the dielectric material thereof. The support base 107 can be formed of a corrosion resistant thermally conductive material, such as a corrosion resistant metal, for example aluminum, an aluminum alloy, a stainless steel, etc. The support base 107 can be coupled to the substrate support 105 with an adhesive or by mechanical means (e.g., fasteners).

The support base 107 is electrically isolated from the chamber base 124 by the insulator plate 111, and the ground plate 112 is interposed between the insulator plate 111 and the chamber base 124. In some embodiments, the processing chamber 100 further includes a quartz pipe 110, or collar, that at least partially circumscribes portions of the substrate support assembly 136 to prevent corrosion of the ESC substrate support 105 and, or, the support base 107 from contact with corrosive process gases or plasma, cleaning gases or plasma, or byproducts thereof. Typically, the quartz pipe 110, the insulator plate 111, and the ground plate 112 are circumscribed by a liner 108. Herein, a plasma screen 109 approximately coplanar with the substrate receiving surface of the ESC substrate support 105 prevents plasma from forming in a volume between the liner 108 and the one or more sidewalls 122.

The substrate support 105 can be formed from a dielectric material, such as a bulk sintered ceramic material, such as a corrosion resistant metal oxide or metal nitride material, for example aluminum oxide ($Al_2O_3$), aluminum nitride (AlN), titanium oxide (TiO), titanium nitride (TiN), yttrium oxide ($Y_2O_3$), or combinations thereof. In embodiments herein, the substrate support 105 further includes a biasing electrode 104 embedded in the dielectric material thereof. In one configuration, the biasing electrode 104 is a chucking pole used to secure (chuck) the substrate 103 to a substrate receiving surface 105A of the substrate support 105, also referred to herein as an ESC substrate support, and to bias the substrate 103 with respect to the processing plasma 101 using one or more of the pulsed-voltage biasing schemes described herein.

The biasing electrode 104 can be formed from one or more electrically conductive parts, such as one or more metal meshes, foils, plates, or combinations thereof. In some embodiments, the biasing electrode 104 is electrically coupled to a bias compensation module 116, which provides a chucking voltage thereto, such as static DC voltage between about −5000 V and about 5000 V, using an electrical conductor, such as the coaxial transmission line 106 (e.g., a coaxial cable). The high voltage module 116 includes bias compensation circuit elements 116A, a DC power supply 155, and a blocking capacitor 153. A bias compensation module blocking capacitor, which is also referred to herein as the blocking capacitor 153, is disposed between the output of a pulsed-voltage waveform generator (PVWG) 150 and the biasing electrode 104.

The biasing electrode 104 is spaced apart from the substrate receiving surface 105A of the substrate support 105, and thus from the substrate 103, by a layer of dielectric material of the substrate support 105. Depending on the type of electrostatic chucking method utilized within the substrate support 105 to retain a substrate 103 during processing, such as a coulombic ESC or a Johnsen-Rahbek ESC, the effective circuit elements used to model the electrical coupling of the biasing electrode 104 to the plasma 101 will vary. Herein, the biasing electrode 104 is electrically coupled to the output of the pulsed-voltage waveform generator (PVWG) 150 using the external conductor, such as the transmission line 106, which is disposed within the support shaft 138.

The substrate support assembly 136 can further include an edge control electrode 115 formed from a conductive material that is positioned below the edge ring 114 (e.g., process kit) and surrounds the biasing electrode 104. For example, edge control electrode can adjust on-wafer etch feature tilting at the edge. When the edge control electrode 115 is biased, due to its position relative to the substrate 103, it can affect or alter a portion of the generated plasma 101 that is at or outside of the edge of the substrate 103. The edge control electrode 115 can be biased by use of a PVWG 150 that is different from the PVWG 150 that is used to bias the biasing electrode 104. In some embodiments, a first PV waveform generator 150 of a first PV source assembly 196 is configured to bias the biasing electrode 104, and a second PV waveform generator 150 of a second PV source assembly 197 is configured to bias the edge control electrode 115. In some embodiments, the edge control electrode 115 is positioned within a region of the substrate support 105, as shown in FIG. 1. In general, if processing chambers 100 is configured to process circular substrates, the edge control electrode 115 can be annular in shape (e.g., a ring electrode) and can be configured to surround at least a portion of the biasing electrode 104. In some embodiments, as illustrated in FIG. 1, the edge control electrode 115 includes a conductive mesh, foil or plate that is disposed a similar distance (i.e., Z-direction) from the surface 105A of the substrate support 105 as the biasing electrode 104. In some other embodiments, the edge control electrode 115 includes a conductive mesh, foil or plate that is positioned on or within a region of the dielectric pipe 110 (e.g., AlN, or $Al_2O_3$), which surrounds at least a portion of the biasing electrode 104 and/or the substrate support 105. Alternately, in some embodiments, the edge control electrode 115 is positioned within or is coupled to the edge ring 114, which is disposed adjacent to the substrate support 105. In this configuration, the edge ring 114 is formed from a semiconductor or dielectric material (e.g., AlN or $Al_2O_3$).

The plasma processing chamber 100 further includes a controller 126. The controller 126 can include a central processing unit (CPU) 133, a memory 134, and support circuits 135. The controller 126 is used to control the process sequence used to process the substrate 103 including the substrate biasing methods described herein. The CPU 133 is a general-purpose computer processor configured for use in an industrial setting for controlling processing chamber and sub-processors related thereto. The memory 134, which is generally non-volatile memory, may include random access memory, read only memory, floppy or hard disk drive, or other suitable forms of digital storage, local or remote. The support circuits 135 can be coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the controller 126 determines which tasks are performable by the components in the plasma processing chamber 100. Preferably, the program, which is readable by CPU 133 in the controller 126, includes code, which when executed by the processor (CPU 133), perform tasks relating to the monitoring and execution of the electrode biasing scheme described herein. The program will include instructions that are used to control the various hardware and electrical components within the plasma processing chamber 100 to perform the various process tasks and various process sequences used to implement the electrode biasing scheme described herein.

During processing, the PV generators within the PV waveform generators 150 of the first PV source assembly 196 and the second PV source assembly 197 establishes a pulsed voltage waveform on the load disposed with the plasma processing chamber 100. The overall control of the delivery of the PV waveform from each of the PV waveform generators 150 is controlled by use of signals provided from the controller 126. Each PV waveform generator 150 will include a PV generator (e.g., DC power supply) and one or more electrical components, such as high repetition rate switches, capacitors (not shown), inductors (not shown), fly back diodes (not shown), power transistors (not shown) and/or resistors (not shown), that are configured to provide a PV waveform.

The PV transmission line 157 electrically connects the output of the PV waveform generator 150 to the second filter assembly 151. The PV transmission line 158 of the second PV source assembly 197 couples a PV waveform generator 150 to the edge control electrode 115, will include the same or similar components. The electrical conductor(s) within the various parts of the PV transmission line 157, 158 may include elements such as: (a) a coaxial transmission line (e.g., coaxial line 106), which may include a flexible coaxial cable that is connected in series with a rigid coaxial transmission line, (b) an insulated high-voltage corona-resistant hookup wire, (c) a bare wire, (d) a metal rod, (e) an electrical connector, or (f) any combination thereof.

Figure 2A:
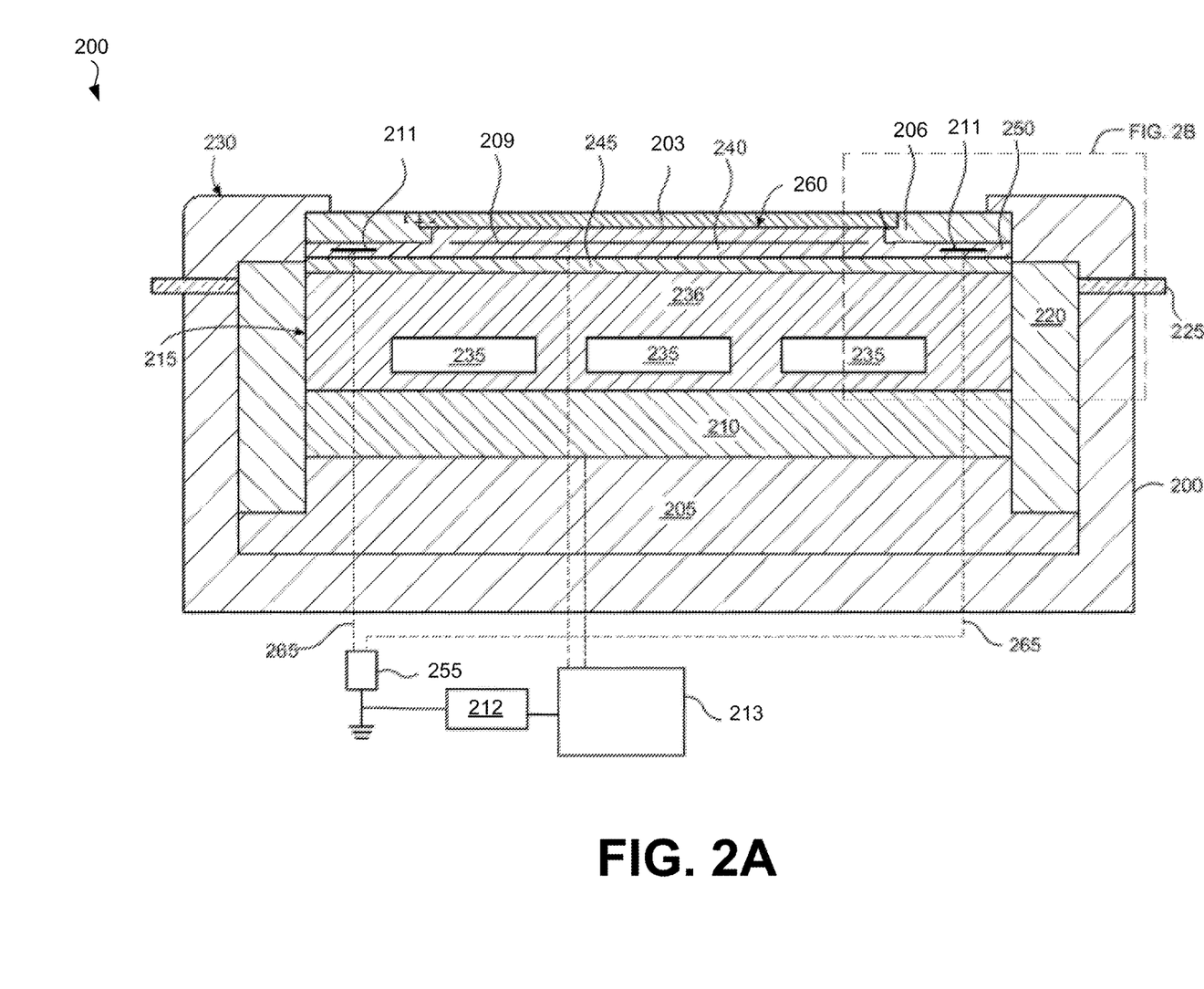
FIGS. 2A-2B are diagrams of schematic side views of portions of a substrate support assembly, in accordance with some embodiments.
Figure 2B:
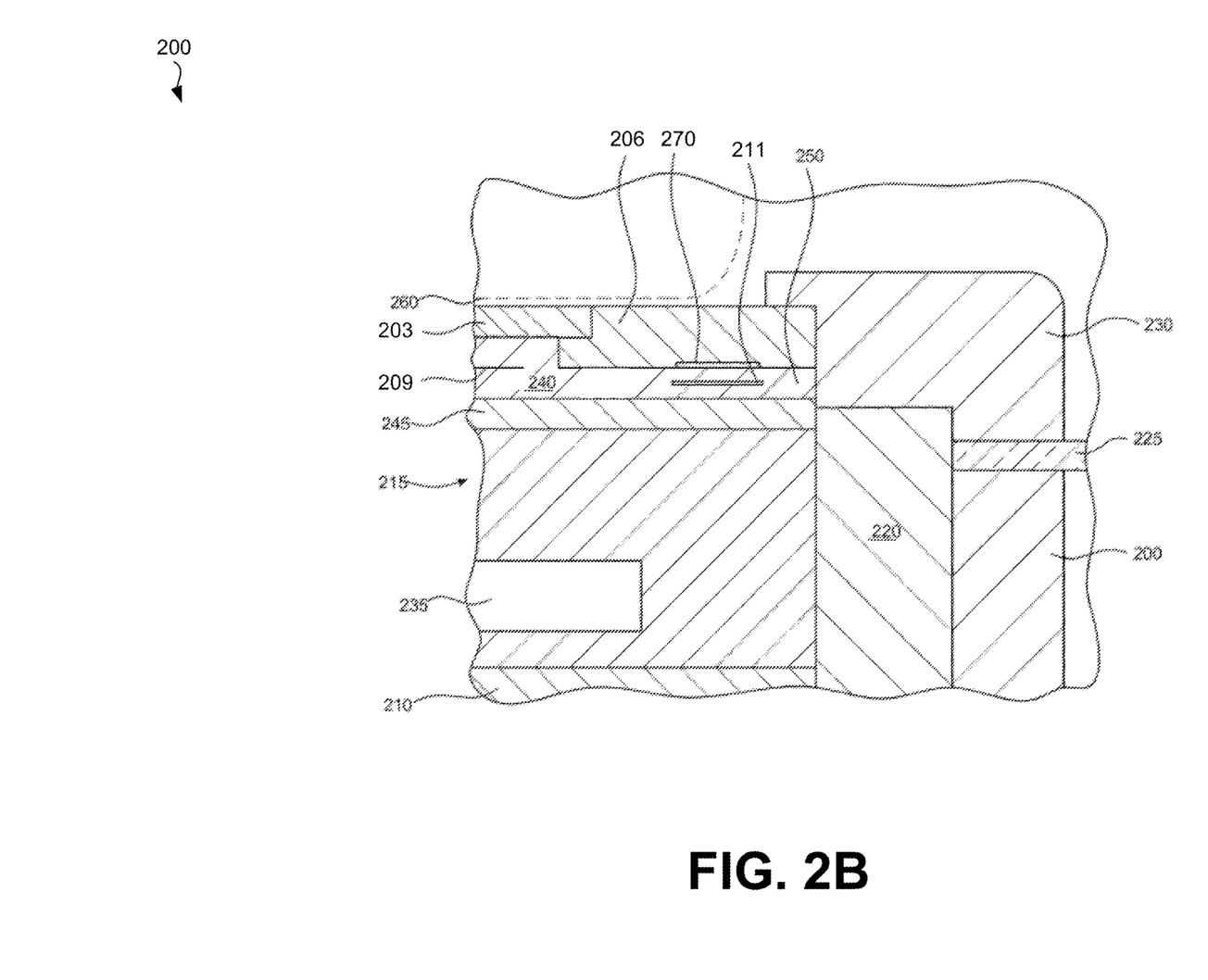

FIGS. 2A and 2B illustrate enlarged schematic side views of portions of a substrate support assembly 204, according to some embodiments. For example, substrate support assembly 204 can be similar to substrate support assembly 204 of FIG. 1. The substrate support assembly 204 includes a ground plate 200 surrounding an insulating layer 205, a facilities plate 210, and an ESC 215 assembled in a vertical stack. A quartz pipe ring 220 circumscribes the facilities plate 210 and the ESC 215 to insulate the ESC 215 from the ground plate 200. The ESC 215 includes one or more chucking electrodes (e.g., the first electrode 209) embedded therein for chucking the substrate 203 to a support surface of the ESC 215. A plasma shield 225 is disposed on an upper surface of the ground plate 200 to facilitate plasma containment in a process chamber. A quartz ring 230 is positioned on an upper surface of the plasma shield 225.

The facilities plate 210 can be made of a conductive material, such as aluminum, or other suitable conductive material, and is positioned between a lower portion of the ground plate 200 and the ESC 215. The facilities plate 210 is configured to route fluid and/or gas from an input location (e.g., at a bottom thereof not shown) to an output location (e.g., at a top thereof, not shown). The ESC 215 includes one or more channels 235 formed in a first material 236 through which a fluid is provided to facilitate temperature control of the substrate support assembly 204. The first material 236 is a metallic material, such as aluminum. The ESC 215 includes the first electrode 209 embedded in a second material 240. The second material 240 is a dielectric material, such as a ceramic material, such as alumina or aluminum nitride. A heater 245 is disposed adjacent to or in the ESC 215 to facilitate temperature control of the substrate 203. The heater 245 may be, for example, a resistive heater having a plurality of resistive heating elements embedded therein.

An edge control electrode 211 (e.g., ring electrode) is embedded in an edge region 250 of the ESC 215. For example, in the illustrated embodiment, the edge control electrode 211 is embedded in the edge region 250 of the second material 240. In some embodiments, the edge control electrode 211 is a ring electrode.

The edge control electrode 211 may be positioned about 0.3 millimeters to about 1 millimeter from the upper surface of the edge region 250, such as about 0.75 millimeters. The edge control electrode 211 may have a width of about 3 millimeters to about 20 millimeters, such as about 15 millimeters.

The edge control electrode 211 is positioned radially outward of the perimeter of the substrate 203 and beneath the edge ring 206. In one example, the edge control electrode 211 may have an inner diameter greater than 200 millimeters, or greater than 300 millimeters, or greater than 450 millimeters. The edge control electrode 211 is electrically coupled to ground and/or matching network 212 through the edge tuning circuit 255 which can include one or more capacitors and/or inductors. The edge control electrode 211 may be coupled to the edge tuning circuit 255 through multiple transmission lines 265 (two are shown). For example, the edge control electrode 211 may be coupled to the edge tuning circuit 255 through three transmission lines 265 spaced about the substrate support assembly 204 at even intervals (e.g., 120 degrees).

The edge ring 206 is positioned on (over) the edge region 250 and in contact with the edge region 250 and the second material 240. In one example, the edge ring 206 may be formed from silicon carbide, graphite coated with silicon carbide, or low resistivity doped silicon. The edge ring 206 circumscribes the substrate 203 and reduces undesired etching or deposition of material at the radially outward edge of the substrate 203.

Referring to FIG. 2B, during processing, a plasma sheath 260 may form over the surface of the substrate 203 (shown as a dashed line in FIG. 2B). As described above, processing conditions may erode the upper portion of the edge ring 206, causing undesired processing of the edge of the substrate 203, such as rounding, sometimes referred to as a "rollover effect". The undesired processing reduces device yield and affects center-to-edge uniformity. To reduce these undesired effects, conventional approaches frequently replaced the edge ring 206. However, frequent replacement of the edge ring 206 is expensive both in terms of the cost of a new edge ring and in terms of the significant down time required for the replacement of the edge ring.

The edge control electrode 211 can be coupled to ground and/or a power source 213, such as an RF generator or PV waveform generator, through either the edge tuning circuit 255 or the matching network 212 to adjust the RF amplitude (and/or phase), and thus the plasma sheath 260, near the edge ring 206. In addition, two or more of the power sources 213 and the matching network 212 are configured to be shared during use by the substrate 203 and the edge control electrode 211 disposed beneath the edge ring 206.

In some embodiments, a plasma sheath 260 above the edge ring 206 that is thicker or thinner than the plasma sheath 260 above the substrate 203 is desired in order to tune one or a combination of the film etching, deposition profile, or feature tilting angle near the substrate edge. Controlling the RF amplitude and/or RF phase at the edge ring 206 relative to the RF amplitude and/or RF phase at the substrate 203 allows such process edge profile tuning.

Due to the relatively reduced thickness of the edge region 250 in contrast to conventional approaches, RF power initially delivered to the ESC 215 has a high RF coupling with the edge ring 206. In other words, the RF amplitude on the edge ring 206 could be higher than the RF amplitude on the substrate 203.

A gap 270 may be provided between an upper surface of the ceramic ring 250 and a lower surface of the edge ring 206. The gap 270 may be utilized to decrease coupling between the ring electrode and the plasma sheath 260 to reduce the RF current to edge tuning circuit 255. The thickness of the gap 270 may be selected to provide a desired amount of decoupling. In addition to the examples described above, other examples of the disclosure are also contemplated. In one example, the length of the transmission line 265 may have a length that is one half of the wavelength λ (i.e., λ/2) to facilitate matched impedance, in at least one frequency. In another example, the width of the edge control electrode 211 may be selected to increase or decrease electrical coupling with the edge ring 206, as desired. In another example, the gap 270 may be omitted. In another example, a conductive thermal gasket, for example, a silicone-based thermal gasket, may occupy the gap 270.

In another example, the edge tuning circuit 255 may be coupled to the match network 212 and then to the power source 213 instead of, or in addition to, ground. In such an example, the edge tuning circuit 255 would facilitate adjustment of capacitive coupling, rather than a parasitic effect as described above.

The edge tuning circuit 255 can include one or more variable capacitors as well as one or more inductors coupled to the edge control electrode 211. The resonant frequencies of the tuning circuit can be substantially close to the operating frequency, which enables a large variation of RF amplitude that is much larger and much smaller than the RF amplitude of the substrate.

Figure 3A:
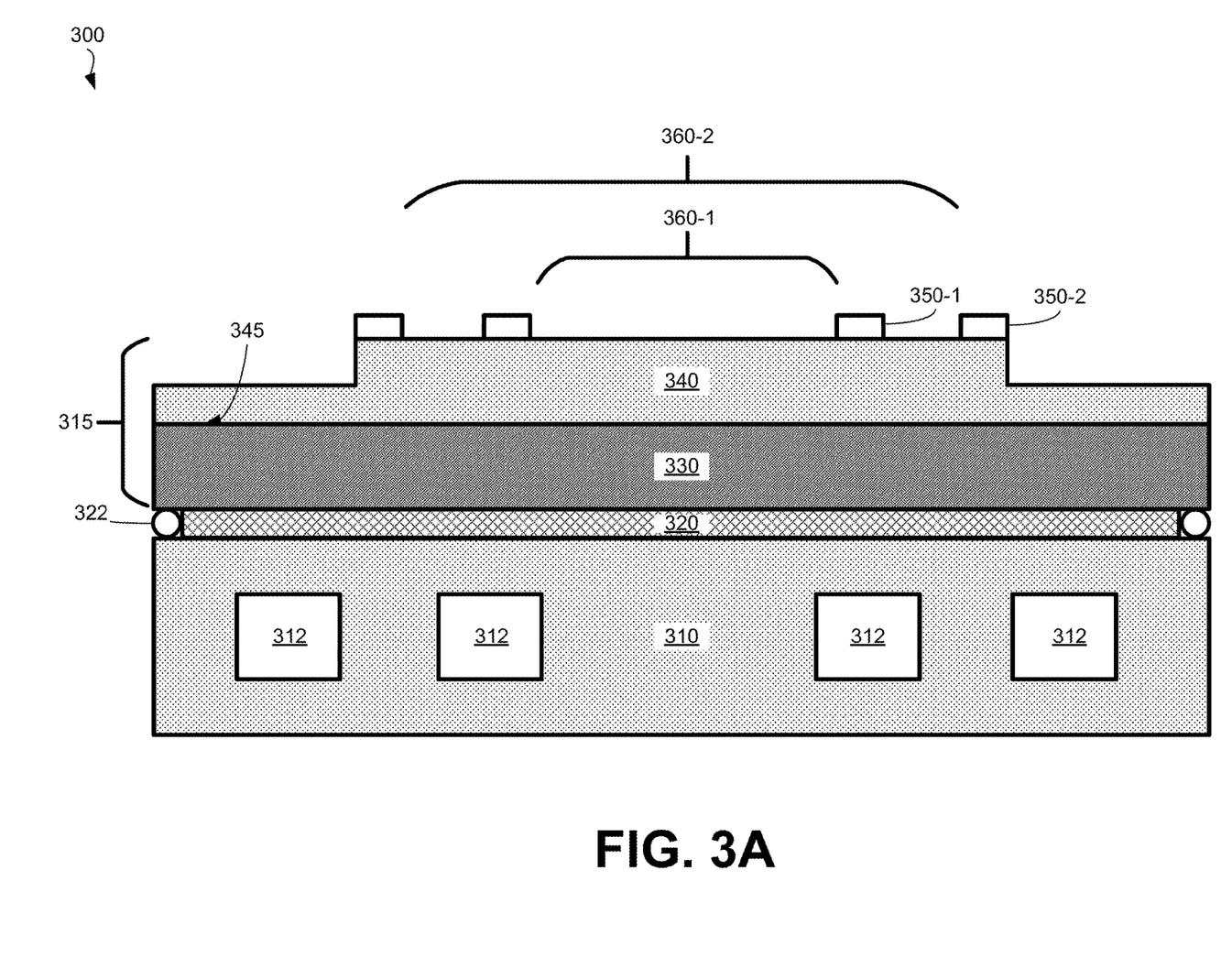
FIGS. 3A, 3B and 4 are diagrams of cross-sectional views of example substrate support assemblies including hybrid pucks to improve thermal performance and leakage current stability, in accordance with some embodiments.
Figure 3B:
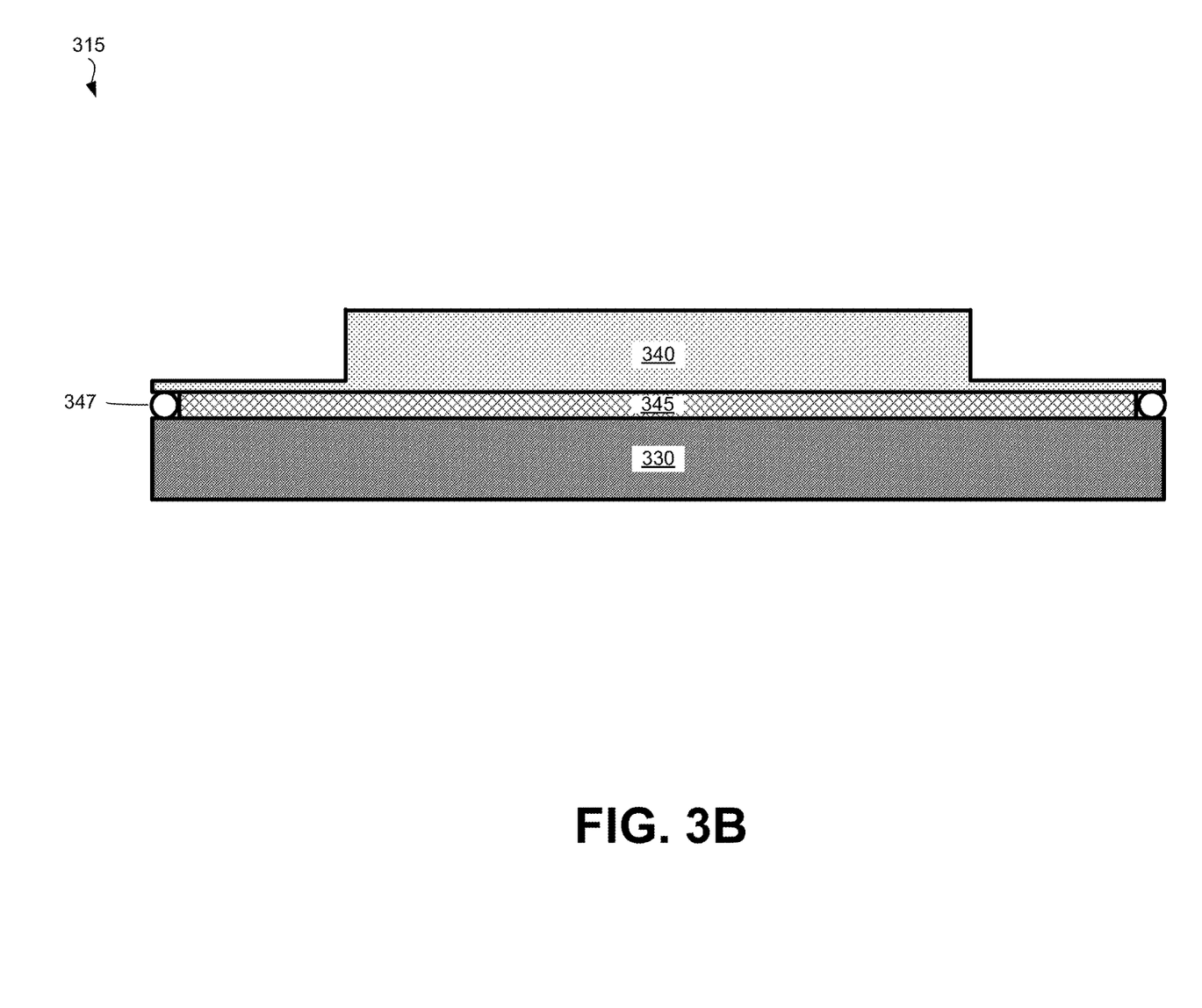

FIGS. 3A-3B are cross-sectional views of an example substrate support assembly 300, in accordance with some embodiments. Substrate support assembly 300 can be used within a processing chamber to process a substrate (e.g., deposition, etching and/or lithography). As shown, substrate support assembly 300 includes a base structure including cooling plate 310 and hybrid puck 315 disposed on cooling plate 310. Hybrid puck 315 corresponds to an ESC.

In some embodiments, and as shown in FIG. 3A, hybrid puck 315 is bonded to cooling plate 310 via bonding layer 320. More specifically, hybrid puck 315 includes backing region 330 and chucking region 340, where backing region 330 is bonded to cooling plate 310 via bonding layer 320. Chucking region 340 is designed to securely hold a substrate. In some embodiments, chucking region 340 has a circular shape as viewed from the top of hybrid puck 315 to secure a circular substrate. In some embodiments, chucking region 340 has a rectangular shape as viewed from the top of hybrid puck 315 to secure a rectangular substrate. As shown, chucking region 340 can be formed to have a plateau shape having a center region that is elevated relative to a pair of end regions. In other words, the surface of the center region is elevated relative to the surfaces of the end regions.

In some embodiments, as shown in FIG. 3A, at least one bond protection structure 322 can be disposed between cooling plate 310 and backing region 330. For example, at least one bond protection structure 322 can include at least one O-ring and/or at least one gasket. At least one bond protection structure 322 can include any suitable material. In some embodiments, at least one bond protection structure 322 includes an elastomer. For example, at least one bond protection structure 322 can include a polyimide, a perfluoropolymer (PFP), etc.

Cooling plate 310 can have multiple cooling channels 312 embedded therein. Cooling channels 312 are pathways that allow a cooling fluid (e.g., water, fluorinert) to flow through hybrid puck 315 to dissipate heat during substrate (e.g., wafer) processing without interfering with the ability of hybrid puck 315 to hold the wafer securely in place. The purpose of cooling plate 310 is to keep the temperature of hybrid puck 315 and the substrate within a safe range to prevent damage to the ESC, the substrate and/or the rest of the processing chamber. The design and configuration of cooling channels 312 can depend on different variables, such as the structure of substrate support assembly and/or the manufacturing processes being used to process the substrate.

Backing region 330 is formed from a first dielectric material and chucking region 340 is formed from a second dielectric material different from the first dielectric material. For example, the first dielectric material can provide high thermal conductivity (which can enable improved heat flow to cooling plate 310) and the second dielectric material can offer leakage current stability. In some embodiments, the first dielectric material has a thermal conductivity that ranges between about 150 Watts per meter Kelvin (W/m-K) to about 200 W/m-K). For example, the first dielectric material can have a thermal conductivity of about 180 W/m-K. In some embodiments, the second dielectric material has a thermal conductivity that ranges between about 10 W/m-K to about 50 W/m-K. For example, the second dielectric material can have a thermal conductivity of about 30 W/m-K. In some embodiments, at least one of the first dielectric material or the second dielectric material is a ceramic material. For example, the first dielectric material can include AlN and the second dielectric material can include $Al_2O_3$. In addition to enabling leakage current stability, the second dielectric material can enable improved scratch resistance, direct current (DC) and radio frequency (RF) separation, better RF coupling for low frequency, a wide operating temperature range, and/or a temperature-independent operation range.

In some embodiments, hybrid puck 315 has a thickness that ranges between about 5 millimeters (mm) to about 10 mm. In some embodiments, backing region 330 has a thickness that ranges from about 2.5 mm to about 5 mm. In some embodiments, chucking region 340 has a thickness that ranges from about 2.5 mm to about 5 mm. In some embodiments, the thickness of backing region 330 is approximately equal to the thickness of chucking region 340. In some embodiments, the thickness of backing region 330 is different from the thickness of chucking region 340.

In some embodiments, and as shown in FIG. 3A, backing region 330 is bonded to chucking region 340 via bond 345. For example, bond 345 can be a diffusion bond. As another example, bond 345 can be a metal bond. A metal bond may include an "interlayer" of aluminum foil which is placed in a bonding region between chucking region 340 and backing region 330. Pressure and heat may be applied to form a diffusion bond between the aluminum foil and chucking region 340 and between the aluminum foil and backing region 330. In another embodiment, a diffusion bond may be formed using other interlayer materials which are selected based upon the materials used for chucking plate and backing plate. In another embodiment, chucking region 340 may be directly bonded to backing region 340 using direct diffusion bonding in which no interlayer is used to form bond 345.

In some embodiments, as shown in FIG. 3B, at least one bond protection structure 347 can be disposed between backing region 330 and chucking region 340, and bond 345 can be disposed between backing region 330 and chucking region 340. For example, at least one bond protection structure 347 can include at least one O-ring and/or at least one gasket. At least one bond protection structure 347 can include any suitable material. In some embodiments, at least one bond protection structure 347 includes an elastomer. For example, at least one bond protection structure 347 can include a polyimide, PFP, etc.

As will be described in further detail below with reference to FIGS. 5A-5D, a set of electrodes can be embedded within hybrid puck 315. For example, chucking electrodes can be embedded within chucking region 340 to enable a substrate to be securely held to chucking region 340. In some embodiments, an edge control electrode can be embedded within chucking region 340 to improve performance. For example, an edge control electrode can be a ring electrode. In some embodiments, a heating electrode is embedded within backing region 330.

Substrate support assembly 300 can further include at least one band defining at least one cooling zone. In this example, the at least one band includes inner seal band 350-1 defining inner cooling zone 360-1 and outer seal band 350-2 defining outer cooling zone 360-2. Each cooling zone can include cooling channels that allow for the cooling fluid to flow through substrate support assembly 300 for heat dissipation to prevent thermal stress on the substrate that can result in substrate defects (e.g., cracking or warping).

In some embodiments, instead of being bonded via bond 320, hybrid plate 315 may be coupled to cooling plate 310 via one or more fasteners. In some embodiments, hybrid plate 315 includes multiple features. The features may match similar features in cooling plate 310 to which the hybrid plate 315 is mounted. Each feature accommodates a fastener. For example, a bolt (e.g., a stainless steel bolt, galvanized steel bolt, etc.) may be placed into each feature such that a head of the bolt is inside of an opening large enough to accommodate the head and a shaft of the bolt extends out of a bottom side of the hybrid plate 315. The bolt may be tightened onto a nut that is placed in a corresponding feature in cooling plate 310. Alternatively, features may be sized to accommodate a threaded insert such as a nut, and may include a hole that can receive a shaft of a bolt that is accommodated by a corresponding feature in the cooling plate. In another example, a helical insert (e.g., a Heli-Coil®) or other threaded insert (e.g., a press fit insert, a mold-in insert, a captive nut, etc.) may be inserted into one or more of the features to add a threaded hole thereto. A bolt placed inside of the cooling plate and protruding from cooling plate 310 may then be threaded into the threaded insert to secure cooling plate 310 to hybrid plate 315. Alternatively, threaded inserts may be used in cooling plate 310. In one embodiment, backing region 330 includes the features for accommodating threaded inserts and/or threaded fasteners, and chucking plate 340 lacks such features. Accordingly, the threaded inserts and/or heads of threaded fasteners may be fully encapsulated within hybrid plate 315. The features may be slightly oversized as compared to a size of the fasteners to accommodate a greater coefficient of thermal expansion of the fasteners. In some embodiments, the fasteners are sized such that the fasteners will not exert a force on the features when the fasteners are heated to a temperature that ranges between about 250° C. to about 600° C.

Multiple sets of features may be included in hybrid plate 315. Each set of features may be evenly spaced at a particular radius or distance from a center of hybrid plate 315. For example, a first set of features may be located at a radius R1 and a second set of features may be located at a radius R2. Additional sets of features may also be located at additional radii. In some embodiments, the features are arranged to create a uniform load on hybrid plate 315. In some embodiments, the features are arranged such that a bolt is located approximately every 30-70 square centimeters (e.g., every 50 square centimeters).

The fasteners may be tightened to compress a bond protection structure (e.g., O-ring or gasket). The fasteners may all be tightened with approximately the same force to cause a separation between hybrid plate 315 and cooling plate 315 to be approximately the same (uniform) throughout the interface between hybrid plate 315 and cooling plate 310. This may ensure that the heat transfer properties between hybrid plate 315 and cooling plate 310 are uniform.

Figure 4:
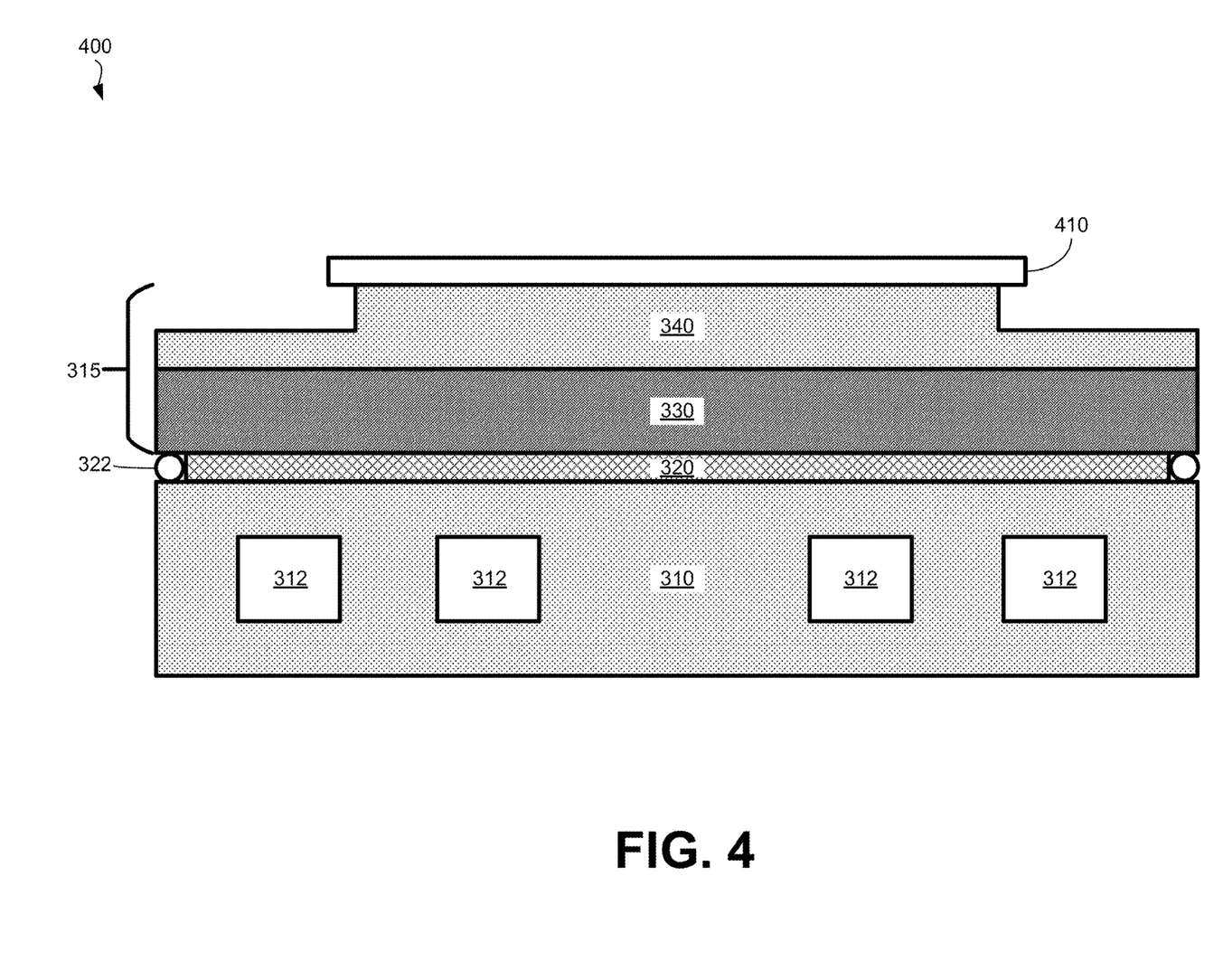

FIG. 4 is a cross-sectional view of system 400, in accordance with some embodiments. As shown, the system 400 includes substrate (e.g., wafer) 310 securely held to a surface of chucking region 340 of hybrid puck 315, as described above with reference to FIG. 3. More specifically, a voltage having a suitable magnitude can be applied to chucking electrodes embedded within chucking region 340 to generate a suitable electrostatic force to secure substrate 410 to chucking region 340. Examples of hybrid pucks including sets of electrodes will now be described in further detail below with reference to FIGS. 5A-5D.

Figure 5A:
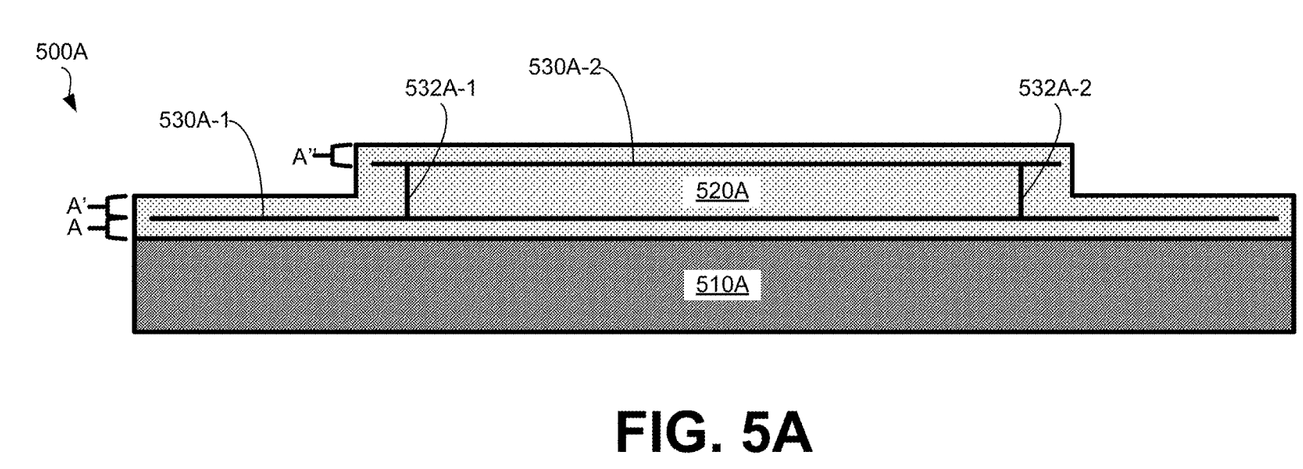
FIGS. 5A-5D are diagrams of cross-sectional views of hybrid pucks to improve thermal performance and leakage current stability, in accordance with some embodiments.

FIG. 5A is a cross-sectional view of hybrid puck 500A, in accordance with some embodiments. As shown, hybrid puck 500A includes backing region 510A and chucking region 520A, similar to backing region 330 and chucking region 340 described above with reference to FIGS. 3-4. As further shown, a set of electrodes is embedded within chucking region 520A. More specifically, the set of electrodes can include chucking electrodes 530A-1 and 530A-2 that can be used to generate an electrostatic force to securely hold a substrate (e.g., substrate 410 of FIG. 4) disposed on chucking region 520A upon application of a suitable voltage. As further shown, chucking electrodes 530A-1 and 530A-2 are electrically connected via connectors 532A-1 and 532A-2. Accordingly, chucking electrodes 530A-1 and 530A-2 are dependent chucking electrodes.

The thickness of the portion of chucking region 520A defined between the bottom surface of chucking region 520A to chucking electrode 530A-1 is denoted by "A". The thickness of the portion of chucking region 520A defined between chucking electrode 530A-1 and the surfaces of the end regions of the plateau shape of chucking region 520A is denoted by "A'". The thickness of the portion of chucking region 520A defined between chucking electrode 530A-2 and the surface of the center region of the plateau shape of chucking region 520A (e.g., upper surface of chucking region 520A) is denoted by "A''". In some embodiments, A, A' and A'' are each approximately equal. In some embodiments, at least one of A, A' or A'' is different.

Figure 5B:
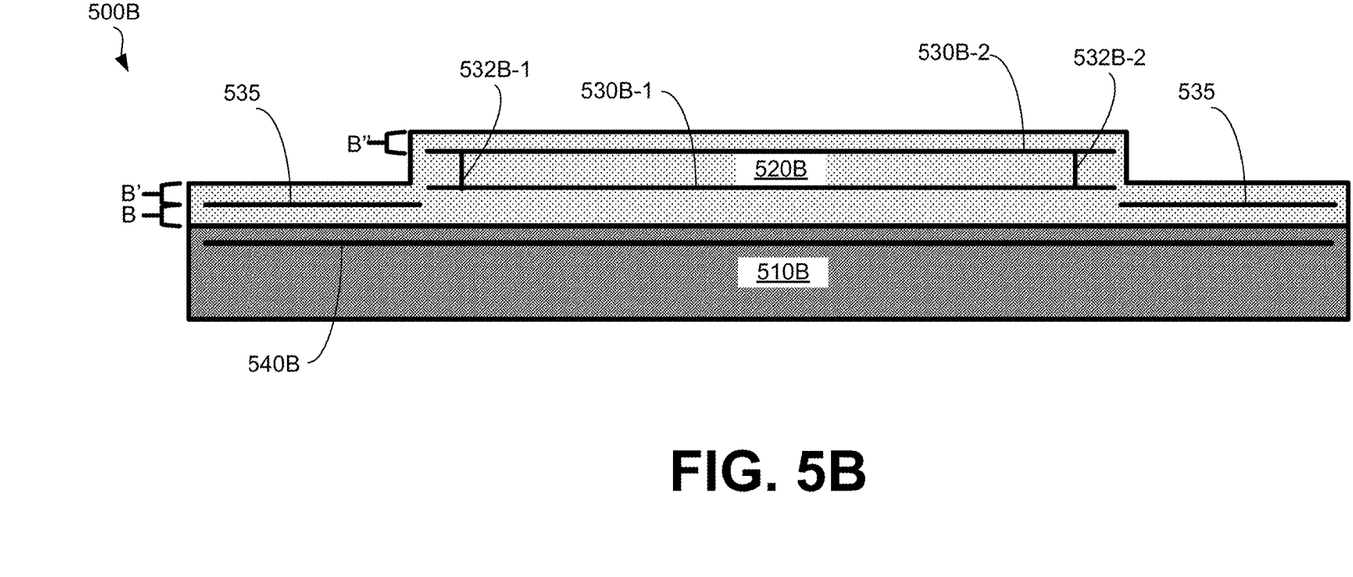

FIG. 5B is a cross-sectional view of hybrid puck 500B, in accordance with some embodiments. As shown, hybrid puck 500B includes backing region 510B and chucking region 520B, similar to backing region 330 and chucking region 340 described above with reference to FIGS. 3-4. As further shown, a set of electrodes is embedded within chucking region 520B and backing region 510B. More specifically, the set of electrodes can include chucking electrodes 530B-1 and 530B-2 embedded within chucking region 520B that can be used to generate an electrostatic force to securely hold a substrate (e.g., substrate 410 of FIG. 4) disposed on chucking region 520B upon application of a suitable voltage. In some embodiments, to improve performance, the set of electrodes can include edge control electrode 535 embedded within chucking region 520B. In some embodiments, edge control electrode 535 is a ring electrode, and can be independently controlled with respect to chucking electrodes 530B-1 and 530B-2. Although not shown in FIG. 5A, chucking region 520A can include a similar edge control electrode.

In some embodiments, the set of electrodes can further include heater electrode 540B embedded within backing region 510B. Heater electrode 540B can include a material that can generate heat caused by the application of current from a power source (e.g., a metal material). Heat generated by heater electrode 540B can maintain the temperature of the ESC and/or substrate. Heater electrode 540B can work in conjunction with the cooling system (e.g., cooling channels 312 of cooling plate 310 of FIGS. 3-4) to control temperature throughout substrate processing. Although not shown in FIG. 5A, backing region 510A can include a similar heater electrode. As further shown, chucking electrodes 530B-1 and 530B-2 are electrically connected via connectors 532B-1 and 532B-2. Accordingly, chucking electrodes 530B-1 and 530B-2 are dependent chucking electrodes.

The thickness of the portion of chucking region 520B defined between the bottom surface of chucking region 520B to edge control electrode 535 is denoted by "B". The thickness of the portion of chucking region 520B defined between edge control electrode 535 and the surfaces of the end regions of the plateau shape of chucking region 520B is denoted by "B'". The thickness of the portion of chucking region 520B defined between chucking electrode 530B-2 and the surface of the center region of the plateau shape of chucking region 520B (e.g., upper surface) is denoted by "B''". In some embodiments, B, B' and B'' are each approximately equal. In some embodiments, at least one of B, B' or B'' is different.

Figure 5C:
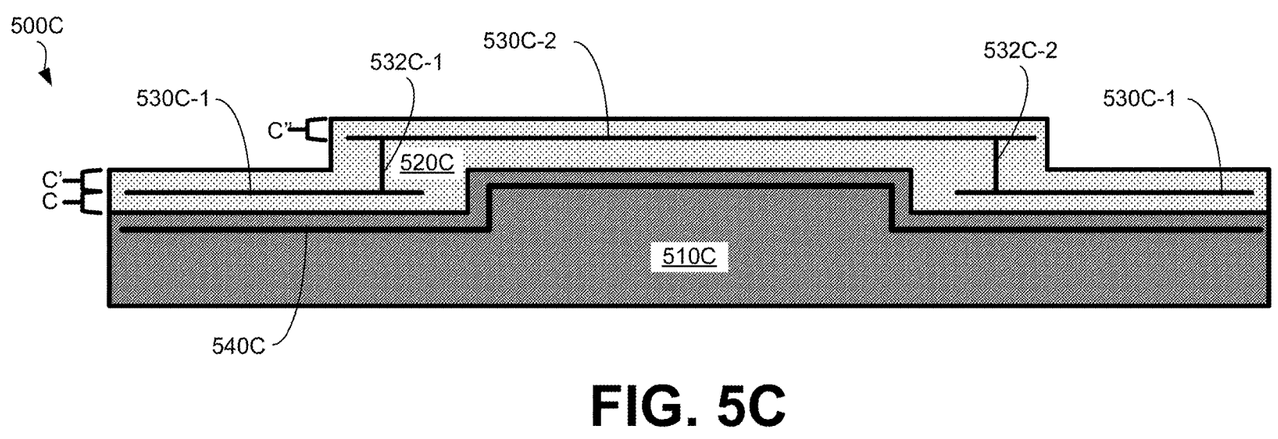

FIG. 5C is a cross-sectional view of hybrid puck 500C, in accordance with some embodiments. As shown, hybrid puck 500C includes backing region 510C and chucking region 520C. In this example, backing region 510C has a similar plateau shape as chucking region 520C. More specifically, similar to chucking region 520C, backing region 510C can be formed to have a plateau shape having a center region that is elevated relative to a pair of end regions. In other words, the surface of the center region of backing region 510C is elevated relative to the surfaces of the end regions of backing region 510C.

As further shown, a set of electrodes is embedded within chucking region 520C and backing region 510C. More specifically, the set of electrodes can include chucking electrodes 530C-1 and 530C-2 embedded within chucking region 520C. For example, chucking electrode 530C-1 can be used to power an edge ring (e.g., edge ring 114 of FIG. 1) and chucking electrode 530C-2 can be used to generate an electrostatic force to securely hold a substrate (e.g., substrate 410 of FIG. 4) disposed on chucking region 520C upon application of a suitable voltage. Although not shown in FIG. 5C, chucking region 520C can alternatively include an edge control electrode (e.g., ring electrode). In some embodiments, the set of electrodes can further include heater electrode 540C embedded within backing region 510C. As shown, heater electrode 540C can follow the contour of the plateau shape of backing region 510C. As further shown, chucking electrodes 530C-1 and 530C-2 are electrically connected via connectors 532C-1 and 532C-2. Accordingly, chucking electrodes 530C-1 and 530C-2 are dependent chucking electrodes. The thickness of the portion of chucking region 520C defined between the bottom surface of chucking region 520C to chucking electrode 530C-1 is denoted by "C". The thickness of the portion of chucking region 520C defined between chucking electrode 530C-1 and the surfaces of the end regions of the plateau shape of chucking region 520C is denoted by "C'". The thickness of the portion of chucking region 520C defined between chucking electrode 530C-2 and the surface of the center region of the plateau shape of chucking region 520C (e.g., upper surface of chucking region 520C) is denoted by "C''". In some embodiments, C, C' and C'' are each approximately equal. In some embodiments, at least one of C, C' or C'' is different.

Figure 5D:
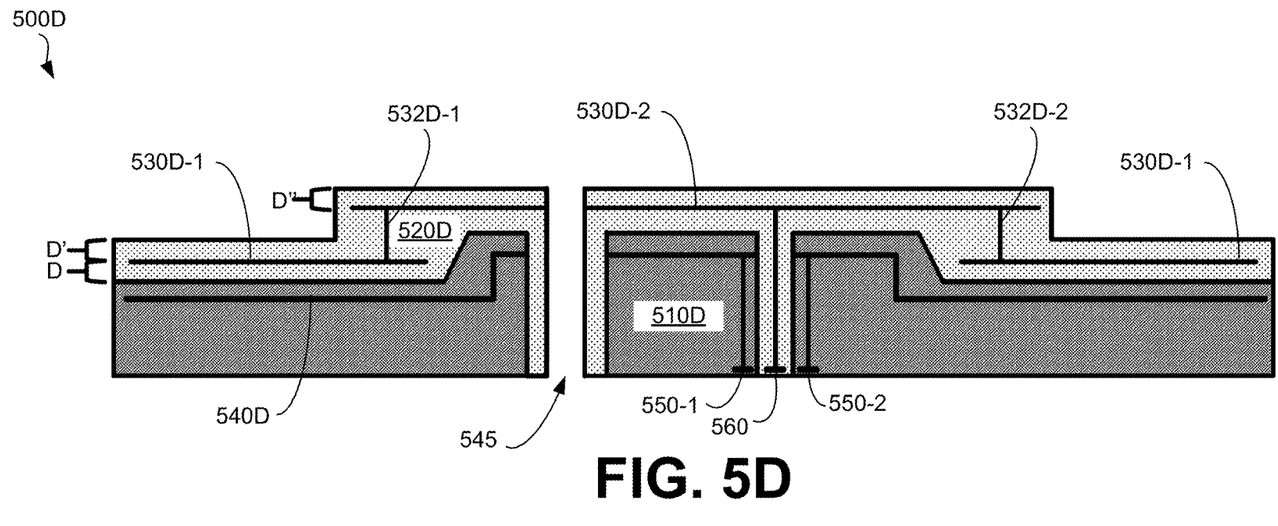

FIG. 5D is a cross-sectional view of hybrid puck 500D, in accordance with some embodiments. As shown, hybrid puck 500D includes backing region 510D and chucking region 520D. In this example, backing region 510D has a plateau shape. More specifically, backing region 510D can be formed to have a plateau shape having a cross-sectional trapezoidal-shaped center region that is elevated relative to a pair of end regions. In other words, the surface of the center region of backing region 510D is elevated relative to the surfaces of the end regions of backing region 510D.

As further shown, a set of electrodes is embedded within chucking region 520D and backing region 510D. More specifically, the set of electrodes can include chucking electrodes 530D-1 and 530D-2 embedded within chucking region 520D that can be used to generate an electrostatic force to securely hold a substrate (e.g., substrate 410 of FIG. 4) disposed on chucking region 420A upon application of a suitable voltage. Although not shown in FIG. 5D, chucking region 520D can include an edge control electrode (e.g., a ring electrode). In some embodiments, the set of electrodes can further include heater electrode 540D embedded within backing region 510D. As shown, heater electrode 540D can follow the contour of the plateau shape of backing region 510D.

As further shown, an opening is formed through hybrid puck 500D corresponding to lift pin area 545 to accommodate a lift pin (e.g., 3 places). A lift pin is a component that can be used to place a substrate onto hybrid puck 500D (e.g., from a robot apparatus) or raise a substrate for removal (e.g., by a robot apparatus). For example, the lift pin can be a metal pin that is mounted on a mechanism that can move the pin up or down (e.g., actuator or piston mechanism). Although not shown in FIGS. 5A-5C, at least one of hybrid puck 500A, hybrid puck 500B or hybrid puck 500C can also include a similar lift pin area (e.g., 3 places). As further shown, hybrid puck 500D can include a set of terminals including heater terminals 550-1 and 550-2 each connected to heater electrode 540D and DC terminal 560 connected to chucking electrode 530D-2. As further shown, chucking electrodes 530D-1 and 530D-2 are electrically connected via connectors 532D-1 and 532D-2. Accordingly, chucking electrodes 530D-1 and 530D-2 are dependent chucking electrodes.

The thickness of the portion of chucking region 520D defined between the bottom surface of chucking region 520D to chucking electrode 530D-1 is denoted by "D". The thickness of the portion of chucking region 520D defined between chucking electrode 530D-1 and the surfaces of the end regions of the plateau shape of chucking region 520D is denoted by "D'". The thickness of the portion of chucking region 520D defined between chucking electrode 530D-2 and the surface of the center region of the plateau shape of chucking region 520D (e.g., the upper surface of chucking region 520D) is denoted by "D''". In some embodiments, D, D' and D" are each approximately equal. In some embodiments, at least one of D, D' or D" is different.

Figure 6:
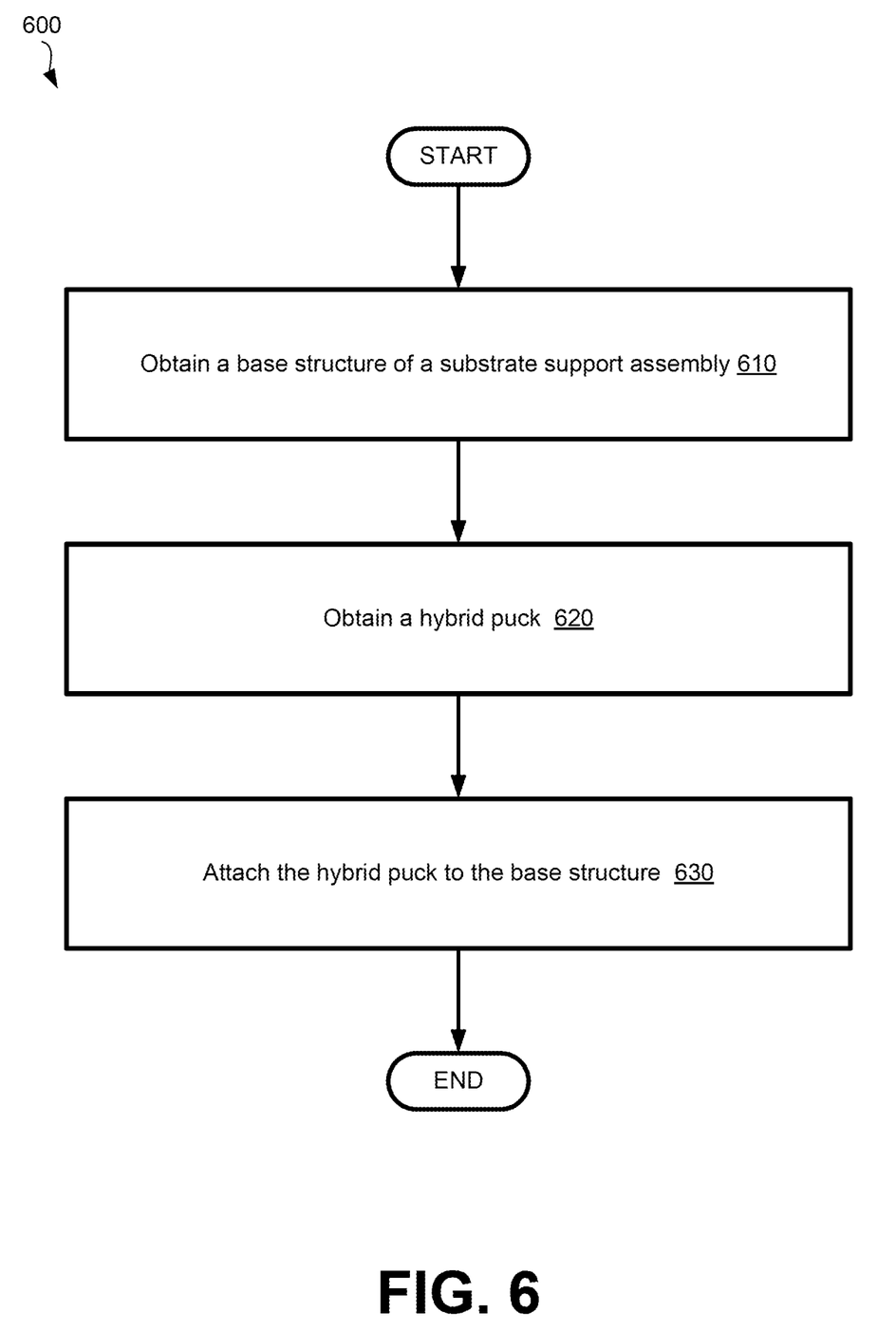
FIG. 6 is a flow chart of an example method for fabricating electrostatic chucks (ESCs) including hybrid pucks, in accordance with some embodiments.

FIG. 6 depicts a flow chart of an example method 600 for fabricating an ESC with a hybrid puck, in accordance with some embodiments. For example, method 600 can be performed to fabricate a portion of a substrate support assembly of a processing chamber to process a substrate.

At block 610, a base structure of an ESC is obtained. For example, the base structure can include a cooling plate having multiple cooling channels embedded therein. In some embodiments, obtaining the base structure includes forming the cooling plate including forming the multiple cooling channels.

At block 620, a hybrid puck is obtained. The hybrid puck can include a backing region and a chucking region disposed on the backing region. The backing region can be formed from a first dielectric material and the chucking region can be formed from a second dielectric material different from the first dielectric material. More specifically, the first dielectric material can be selected to improve thermal performance at the interface between the puck and the cooling plate. The second dielectric material can be selected to improve stability and leakage current consistency for the chucking surface. In some embodiments, at least one of the first dielectric material or the second dielectric material is a ceramic material. In some embodiments, first dielectric material includes AlN. In some embodiments, the second dielectric material includes $Al_2O_3$. In some embodiments, the chucking region and the backing region are bonded together with a bond. The chucking region and the backing region can be bonded together with any suitable type of bond. Examples of bonds include diffusion bonds, metal bonds, etc.

A set of electrodes can be embedded within the hybrid puck. For example, chucking electrodes can be embedded within the chucking region. In some embodiments, an edge control electrode is embedded within the chucking region. For example, the edge control electrode can be a ring electrode. In some embodiments, a heater electrode is embedded within the backing region. In some embodiments, forming the hybrid puck can include forming the set of electrodes within the hybrid puck. In some embodiments, at least a portion of the set of electrodes is embedded within the hybrid puck prior to forming the hybrid puck on the base structure (e.g., the chucking electrodes and/or edge control electrode within the chucking region, and/or the heater electrode within the backing region).

In some embodiments, the hybrid puck further includes a lift pin area (e.g., 3 places). For example, forming the hybrid puck on the base structure can include forming the lift pin area by forming a hole through the hybrid puck (e.g., from the elevated surface of the center region of the chucking region to the bottom surface of the backing region). In some embodiments, the hybrid puck further includes a set of terminals. For example, the set of terminals can include a heater terminal connected to a heater electrode and/or and a DC terminal connected to a chucking electrode.

The hybrid puck can further include at least one cooling zone disposed on the chucking region. In some embodiments, the at least one cooling zone includes an outer cooling zone defined by an outer seal band and an inner cooling zone defined by an inner seal band. For example, forming the hybrid puck on the base structure can include forming the at least one cooling zone on the chucking region.

In some embodiments, obtaining the hybrid puck includes obtaining a preassembled hybrid puck. In some embodiments, obtaining the hybrid puck includes forming the hybrid puck. For example, forming the hybrid puck can include embedding the set of electrodes within the backing region and the chucking region, forming the at least one cooling zone on the chucking region, and bonding the chucking region to the backing region using a bond.

At block 630, the hybrid puck is attached to the base structure. For example, the hybrid puck can be attached to the cooling plate. In some embodiments, attaching the hybrid puck to the base structure includes bonding the backing region of the hybrid puck to the base structure (e.g., cooling plate) via a bonding layer. In some embodiments, attaching the hybrid puck to the base structure includes coupling the backing region of the hybrid puck to the base structure using a set of fasteners. Further details regarding blocks 610-630 are described above with reference to FIGS. 1-5D.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±25%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A device comprising:
a hybrid puck corresponding to an electrostatic chuck, the hybrid puck comprising:
a backing region;
a chucking region disposed on the backing region, wherein the backing region comprises a first dielectric material to improve thermal performance of the hybrid puck, and wherein the chucking region comprises a second dielectric material different from the first dielectric material to improve leakage current stability; and a bond protection structure comprising an elastomer disposed between the backing region and the chucking region.

2. The device of claim 1, wherein at least one of the first dielectric material or the second dielectric material is a ceramic material.

3. The device of claim 1, wherein the first dielectric material is aluminum nitride, and wherein the second dielectric material is aluminum oxide.

4. The device of claim 1, wherein the chucking region is bonded to the backing region via a bond, and wherein the bond is one of a diffusion bond or a metal bond.

5. The device of claim 1, further comprising a set of electrodes embedded within the hybrid puck, wherein the set of electrodes comprises a chucking electrode embedded within the chucking region.

6. The device of claim 5, wherein the set of electrodes further comprises an edge control electrode embedded within the chucking region.

7. The device of claim 5, wherein the set of electrodes further comprises a heater electrode embedded within the backing region.

8. The device of claim 1, further comprising at least one seal band defining at least one cooling zone.

9. The device of claim 8, wherein the at least one seal band comprises an inner seal band defining an inner cooling zone and an outer seal band defining an outer cooling zone.

10. The device of claim 1, further comprising a base structure comprising a cooling plate having a plurality of cooling channels, wherein the hybrid puck is disposed on the base structure.

11. The device of claim 1, wherein the backing region and the chucking region each have a plateau shape defined by a respective center region elevated relative to a respective pair of end regions.

12. A substrate support assembly comprising:
a base structure comprising a cooling plate having a plurality of cooling channels; and
a hybrid puck corresponding to an electrostatic chuck and disposed on the base structure, the hybrid puck comprising a backing region disposed on the base structure, a chucking region disposed on the backing region, and a bond protection structure comprising an elastomer disposed between the backing region and the chucking region, wherein the backing region comprises a first dielectric material to improve thermal performance of the hybrid puck, and wherein the chucking region comprises a second dielectric material different from the first dielectric material to improve leakage current stability.

13. The substrate support assembly of claim 12, wherein the first dielectric material is aluminum nitride, and wherein the second dielectric material is aluminum oxide.

14. The substrate support assembly of claim 12, further comprising a bonding layer disposed between the base structure and the backing region.

15. The substrate support assembly of claim 12, wherein the chucking region is bonded to the backing region via a bond, and wherein the bond is one of a diffusion bond or a metal bond.

16. The substrate support assembly of claim 12, further comprising a set of electrodes embedded within the hybrid puck, wherein the set of electrodes comprises a chucking electrode embedded within the chucking region.

17. The substrate support assembly of claim 16, wherein the set of electrodes further comprises an edge control electrode embedded within the chucking region.

18. The substrate support assembly of claim 16, wherein the set of electrodes further comprises a heater electrode embedded within the backing region.

19. The substrate support assembly of claim 12, further comprising an inner seal band defining an inner cooling zone and an outer seal band defining an outer cooling zone.

20. A method comprising:
obtaining a base structure comprising a cooling plate comprising a plurality of cooling channels; and
attaching, to the base structure, a hybrid puck comprising a backing region disposed on the base structure, a chucking region disposed on the backing region, and a bond protection structure comprising an elastomer disposed between the backing region and the chucking region, wherein the backing region comprises a first dielectric material to improve thermal performance of the hybrid puck, and wherein the chucking region comprises a second dielectric material different from the first dielectric material to improve leakage current stability.

* * * * *